(12) United States Patent
Ishikawa (10) Patent No.: US 8,101,957 B2
(45) Date of Patent: *Jan. 24, 2012

(54) OPTICAL SEMICONDUCTOR DEVICE, LASER CHIP AND LASER MODULE

(75) Inventor: Tsutomu Ishikawa, Yamanashi (JP)

(73) Assignee: Eudyna Devices Inc., Yamanashi (JP)

( * ) Notice: Subject to any disclaimer, the term of this patent is extended or adjusted under 35 U.S.C. 154(b) by 1111 days.

This patent is subject to a terminal disclaimer.

(21) Appl. No.: 11/727,496

(22) Filed: Mar. 27, 2007

(65) Prior Publication Data
US 2007/0230523 A1    Oct. 4, 2007

(30) Foreign Application Priority Data
Mar. 30, 2006  (JP) .................................. 2006-096075

(51) Int. Cl.
*H01L 27/15* (2006.01)
(52) U.S. Cl. .................. 257/84; 257/85; 257/86; 372/36
(58) Field of Classification Search .............. 372/36; 257/84–86
See application file for complete search history.

(56) References Cited

U.S. PATENT DOCUMENTS

| | | | |
|---|---|---|---|
| 5,642,371 A | 6/1997 | Tohyama et al. | |
| 2003/0006225 A1 | 1/2003 | Choa | |
| 2004/0062481 A1 | 4/2004 | Dieckroger | |
| 2004/0105480 A1* | 6/2004 | Sidorin et al. | 372/97 |
| 2006/0045147 A1 | 3/2006 | Sin | |
| 2010/0040101 A1* | 2/2010 | Ishikawa | 372/45.01 |
| 2010/0091805 A1* | 4/2010 | Ishikawa et al. | 372/26 |

FOREIGN PATENT DOCUMENTS

| | | |
|---|---|---|
| JP | 6-97604 A | 4/1994 |
| JP | 7-66487 A | 3/1995 |
| JP | 9-92934 A | 4/1997 |
| JP | 2000-206476 A | 7/2000 |
| JP | 2003318483 A | 11/2003 |
| WO | WO 02/44777 A1 | 6/2002 |

OTHER PUBLICATIONS

Pessa M. et al., "GaInAsP gas-source MBE technology", Thin Solid Films, Elsevier-Sequoia S.A. Lausanne, CH, vol. 267, No. 1, Oct. 15, 1995, pp. 99-105.
Gessner R. et al., "GaInAs/ AlGaInAs DH and MQW Lasers With 1.5-1.7 µ m Lasing Wavelengths Grown by Atmospheric Pressure MOVPE", Electronics Letters, IEE Stevenage, GB, vol. 25, No. 8, Apr. 13, 1989, pp. 516-518.
European Search Report dated Jun. 5, 2007, issued in corresponding European Patent Application No. 07104534.8.
Office Action dated Jun. 10, 2008, issued in corresponding to European Patent Application No. 07 104 534.8.

(Continued)

*Primary Examiner* — Samuel Gebremariam
(74) *Attorney, Agent, or Firm* — Westerman, Hattori, Daniels & Adrian, LLP (57) ABSTRACT

An optical semiconductor device has a semiconductor substrate, an optical semiconductor region and a heater. The optical semiconductor region is provided on the semiconductor substrate and has a width smaller than that of the semiconductor substrate. The heater is provided on the optical semiconductor region. The optical semiconductor region has a cladding region, an optical waveguide layer and a low thermal conductivity layer. The optical waveguide layer is provided in the cladding region and has a refractive index higher than that of the cladding region. The low thermal conductivity layer is provided between the optical waveguide layer and the semiconductor substrate and has a thermal conductivity lower than that of the cladding region.

3 Claims, 8 Drawing Sheets

OTHER PUBLICATIONS

Search Report of corresponding European application No. 07104534, dated Sep. 6, 2007.

Japanese Office Action dated Mar. 16, 2010, issued in corresponding Japanese Patent Application No. 2006-096075.

* cited by examiner

OPTICAL SEMICONDUCTOR DEVICE, LASER CHIP AND LASER MODULE

BACKGROUND OF THE INVENTION

1. Field of the Invention

This invention generally relates to an optical semiconductor device, a laser chip and a laser module.

2. Description of the Related Art

Generally, a wavelength-tunable semiconductor laser has a gain for a laser emission and can select a wavelength of the laser. There are some methods of selecting a wavelength. For example, the methods include a method of changing a resonant wavelength of loss or gain by changing a refractive index or angle of a diffractive grating or an etalon provided in a laser cavity. And the methods include a method of changing a resonant wavelength of the laser cavity by changing an optical length in the laser cavity (refractive index or a physical length of the laser cavity).

The method of changing the refractive index has an advantage in reliability or manufacturing cost, because a mechanical operating portion is not necessary being different from the method of changing the angle or length. The refractive index changing method includes changing a temperature of an optical waveguide, changing a carrier density of the optical waveguide by providing a current, and so on. A semiconductor laser having a Sampled Grating Distributed Reflector (SG-DR) is supposed as a wavelength tunable laser that changes a temperature of an optical waveguide, the SG-DR having a wavelength selection function.

In the semiconductor laser, a reflection spectrum of a plurality of SG-DR regions (reflection region) is controlled, a wavelength is selected with a vernier effect. That is, this semiconductor laser emits a laser light at a wavelength where reflection peaks of two SG-DR regions are overlapped with each other. It is therefore possible to control the lasing wavelength by controlling each of the reflection peaks of the SG-DR regions.

Generally, a heater is provided on a surface of the SG-DR region. The temperature of the optical waveguide of the SG-DR region is changed when the heater generates heat. And the refractive index of the SG-DR region changes. It is therefore possible to control the reflection peak wavelength of the SG-DR region by controlling the heating value of the heater. The heater needs an electrical power when generating heat. And so, Japanese Patent Application Publication No. 9-92934 discloses a method of controlling a refractive index of a reflection region by providing an electrical power to a heater.

Here, a wavelength controllable range of the reflection peak is proportional to an amount of refractive index change of the optical waveguide, an amount of temperature change of the optical waveguide. It is necessary to enlarge the electrical power to be provided to the heater in order to enlarge the wavelength controllable range. However, it is preferable that the semiconductor laser is controlled with low electrical power. It is therefore difficult for the heater to generate sufficient heat with the preferable control power of the semiconductor laser.

SUMMARY OF THE INVENTION

The present invention provides an optical semiconductor device, a laser chip and a laser module in which an optical waveguide is effectively heated with heat generated in a heater.

According to an aspect of the present invention, preferably, there is provided an optical semiconductor device including a semiconductor substrate, an optical semiconductor region and a heater. The optical semiconductor region is provided on the semiconductor substrate and has a width smaller than that of the semiconductor substrate. The heater is provided on the optical semiconductor region. The optical semiconductor region has a cladding region, an optical waveguide layer and a low thermal conductivity layer. The optical waveguide layer is provided in the cladding region and has a refractive index higher than that of the cladding region. The low thermal conductivity layer is provided between the optical waveguide layer and the semiconductor substrate and has a thermal conductivity lower than that of the cladding region.

With the above-mentioned configuration, the heat generated by the heater is provided to the cladding region. The thermal resistance between the optical waveguide layer and the semiconductor substrate is enlarged, because the low thermal conductivity layer is provided. It is thus possible to control the temperature of the optical waveguide layer effectively with the heat generated by the heater. It is therefore possible to effectively control the lasing wavelength of a semiconductor laser having the optical semiconductor device.

According to another aspect of the present invention, preferably, there is provided a semiconductor laser chip including an optical semiconductor device and a gain region. The optical semiconductor device has a semiconductor substrate, an optical semiconductor region and a heater. The optical semiconductor region is provided on the semiconductor substrate and has a width smaller than that of the semiconductor substrate. The heater is provided on the optical semiconductor region. The optical semiconductor region has a cladding region, an optical waveguide layer and a low thermal conductivity layer. The optical waveguide layer is provided in the cladding region and has a refractive index higher than that of the cladding region. The low thermal conductivity layer is provided between the optical waveguide layer and the semiconductor substrate and has a thermal conductivity lower than that of the cladding region. The gain region is provided on the semiconductor substrate and is optically coupled to the optical waveguide layer.

With the above-mentioned configuration, the heat generated by the heater is provided to the cladding region. The thermal resistance between the optical waveguide layer and the semiconductor substrate is enlarged, because the low thermal conductivity layer is provided. It is thus possible to control the temperature of the optical waveguide layer effectively with the heat generated by the heater. It is therefore possible to control the lasing wavelength of the semiconductor laser chip effectively.

According to another aspect of the present invention, preferably, there is provided a laser module including a semiconductor laser chip and a temperature control device. The semiconductor laser chip has an optical semiconductor device and a gain region. The optical semiconductor device has a semiconductor substrate, an optical semiconductor region and a heater. The optical semiconductor region is provided on the semiconductor substrate and has a width smaller than that of the semiconductor substrate. The heater is provided on the optical semiconductor region. The optical semiconductor region has a cladding region, an optical waveguide layer and a low thermal conductivity layer. The optical waveguide layer is provided in the cladding region and has a refractive index higher than that of the cladding region. The low thermal conductivity layer is provided between the optical waveguide layer and the semiconductor substrate and has a thermal conductivity lower than that of the cladding region. The gain region is provided on the semiconductor substrate and is optically coupled to the optical waveguide layer. At least a part of the semiconductor laser chip is arranged on the temperature control device. The temperature control device controls the temperature of at least a part of the semiconductor laser chip.

With the above-mentioned configuration, the temperature control device can control the temperature of the semiconductor laser chip. And it is possible to control the lasing wavelength of the semiconductor laser chip. And the heat generated by the heater is provided to the cladding region. The thermal resistance between the optical waveguide layer and the semiconductor substrate is enlarged, because the low thermal conductivity layer is provided. It is thus possible to control the temperature of the optical waveguide layer effectively with the heat generated by the heater. It is therefore possible to control the lasing wavelength of the laser module effectively.

BRIEF DESCRIPTION OF THE DRAWINGS

Preferred embodiments of the present invention will be described in detail with reference to the following drawings, wherein.

DESCRIPTION OF THE PREFERRED EMBODIMENTS

A description will now be given, with reference to the accompanying drawings, of embodiments of the present invention.

First Embodiment

Figure 1:
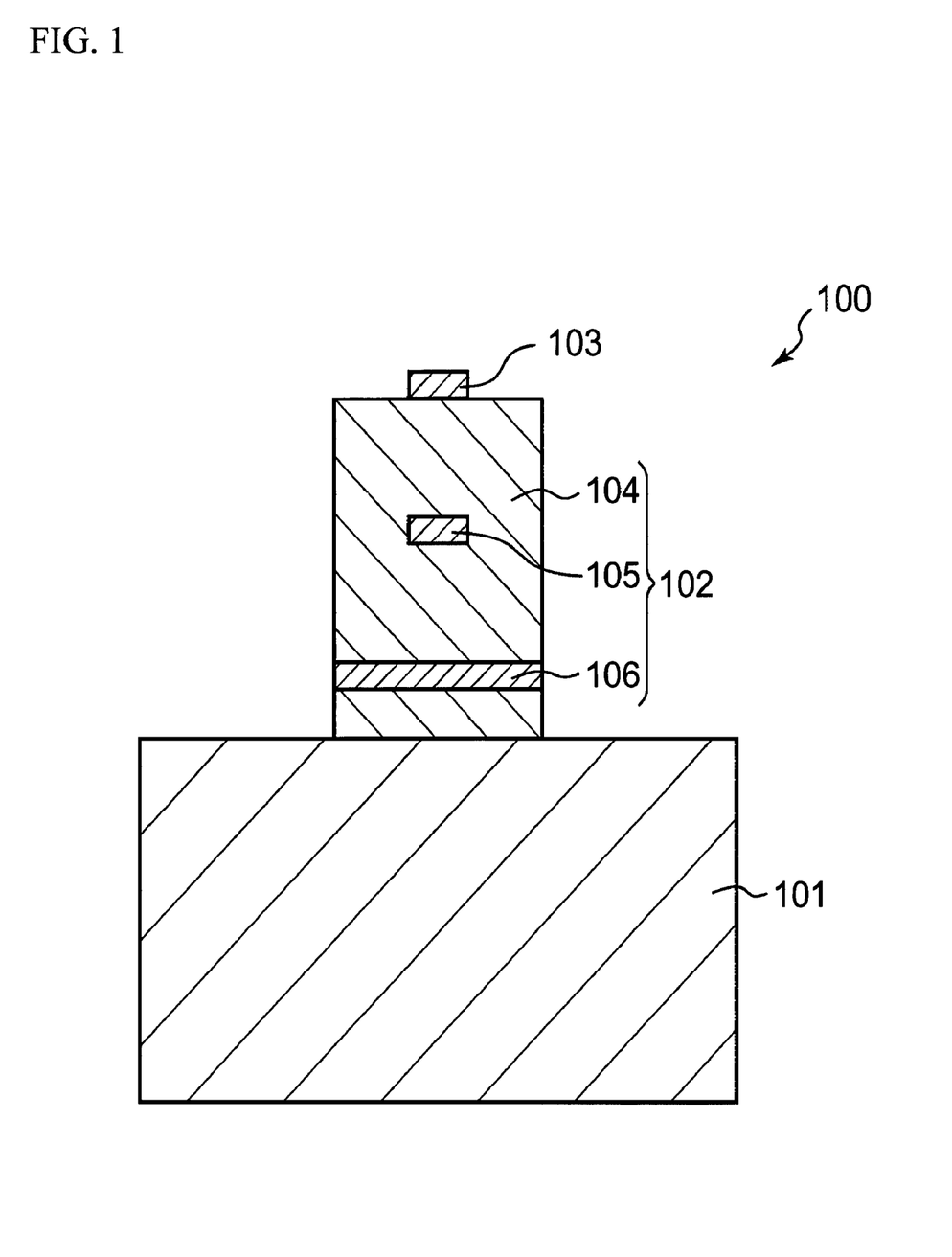
FIG. 1 illustrates a cross sectional view of a distributed reflector in accordance with a first embodiment of the present invention.

In a first embodiment, a description will be given of a distributed reflector as an example of an optical semiconductor device in accordance with the present invention. FIG. 1 illustrates a cross sectional view of a distributed reflector 100 in accordance with the first embodiment. As shown in FIG. 1, the distributed reflector 100 has a structure in which an optical semiconductor region 102 is provided on a center area of a semiconductor substrate 101, the optical semiconductor region 102 having a mesa shape and having a width smaller than that of the semiconductor substrate 101. That is, the optical semiconductor region 102 is projecting from the center area of the semiconductor substrate 101.

The semiconductor substrate 101 is, for example, composed of InP. An insulating layer (not shown) is provided on a top face and a side face of the optical semiconductor region 102 and on an exposed top face of the semiconductor substrate 101. The insulating layer acts as a passivation layer. The insulating layer is, for example, composed of an insulator such as $SiO_2$. A heater 103 is provided on the optical semiconductor region 102. The optical semiconductor region 102 has a structure in which an optical waveguide layer 105 is formed in a center area of a cladding region 104. The cladding region 104 has a low thermal conductivity layer 106 between the optical waveguide layer 105 and the semiconductor substrate 101.

A distance from the top face of the optical semiconductor region 102 to a top face of the optical waveguide layer 105 is, for example, approximately 3 μm. A distance from a lower face of the optical waveguide layer 105 to the low thermal conductivity layer 106 is, for example, 3 μm. A thickness of the low thermal conductivity layer 106 is, for example, 1 μm. A height of the optical semiconductor region 102 is, for example, 20 μm. The cladding region 104 is, for example, composed of InP. The optical waveguide layer 105 is, for example, composed of a material having an absorption edge wavelength at shorter wavelengths side compared to a lasing wavelength. The optical waveguide layer 105 is, for example, composed of InGaAsP crystal.

The low thermal conductivity layer 106 is composed of an alloy semiconductor crystal. The thermal conductivity of the low thermal conductivity layer 106 is therefore lower than that of the cladding region 104. In the embodiment, the low thermal conductivity layer 106 is composed of $In_{1-x}Ga_xAs_yP_{1-y}$, $In_{1-x-y}Al_xGa_yAs$ or $In_{1-x}Al_xAs_yP_{1-y}$. The thickness of the low thermal conductivity layer 106 is, for example, 1 μm. The low thermal conductivity layer 106 may be composed of $Al_xGa_{1-x}As$ alloy semiconductor crystal or $Ga_{1-x}In_xN_yAs_{1-y}$ alloy semiconductor crystal, when GaAs is used for the semiconductor substrate 101. The heater 103 is composed of such as NiCr and generates heat according to an electrical power provided thereto.

The heat generated by the heater 103 is provided to the cladding region 104. The thermal resistance between the optical waveguide layer 105 and the semiconductor substrate 101 is enlarged because the low thermal conductivity layer 106 is provided in the embodiment. It is thus possible to control the temperature of the optical waveguide layer 105 effectively with the heat generated by the heater 103. It is therefore possible to control the lasing wavelength of a semiconductor laser having the distributed reflector 100. Here, the low thermal conductivity layer 106 is provided on overall in a width direction of the optical semiconductor region 102.

It is preferable that the refractive index of the low thermal conductivity layer 106 is lower, because in this case it is restrain that a light propagating in the optical waveguide layer 105 is leaked to the low thermal conductivity layer 106. A description will be given of a preferable composition range of $In_{1-x}Ga_xAs_yP_{1-y}$, $In_{1-x-y}Al_xGa_yAs$ and $In_{1-x}Al_xAs_yP_{1-y}$.

Figure 2A:
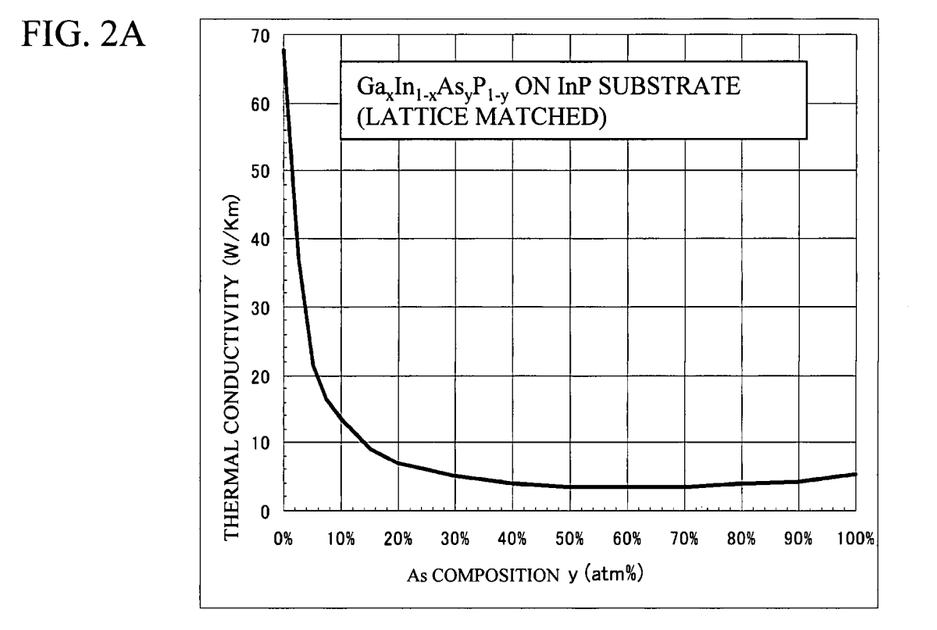
FIG. 2A and FIG. 2B illustrate a relationship between composition and a property of $In_{1-x}Ga_xAs_yP_{1-y}$.
Figure 2B:
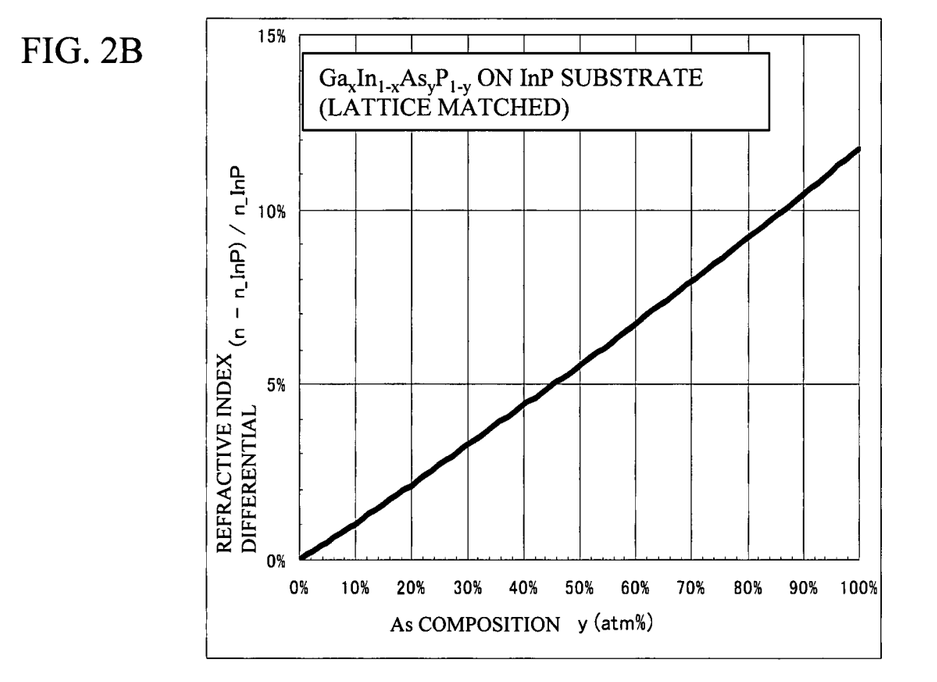

FIG. 2A and FIG. 2B illustrate a relationship between the composition of $In_{1-x}Ga_xAs_yP_{1-y}$ substantially lattice matched to an InP substrate as the semiconductor substrate 101 and the property thereof. FIG. 2A illustrates a relationship between the composition of $In_{1-x}Ga_xAs_yP_{1-y}$ and the thermal conductivity thereof. FIG. 2B illustrates a relationship between the composition of $In_{1-x}Ga_xAs_yP_{1-y}$ and the refractive index thereof. The horizontal axis of FIG. 2A and FIG. 2B indicates the As composition y (atm %). The vertical axis of FIG. 2A indicates the thermal conductivity of $In_{1-x}Ga_xAs_yP_{1-y}$. The vertical axis of FIG. 2B illustrates a ratio of a differential between the refractive index of $In_{1-x}Ga_xAs_yP_{1-y}$ and the refractive index of InP against the refractive index of InP. The ratio is referred to as a refractive index differential D1 (%).

As shown in FIG. 2A, the thermal conductivity of $In_{1-x}Ga_xAs_yP_{1-y}$ gets lower as the As composition y gets higher. This is because a freedom degree of atom arrangement of the semiconductor is enlarged. The thermal conductivity of $In_{1-x}Ga_xAs_yP_{1-y}$ is lower than that of InP, when at least the As composition y>0. It is preferable that the thermal conductivity of a material used for the low thermal conductivity layer 106 is less than 1/10 of that of the cladding region 104. And it is preferable that the As composition y is more than 15%.

On the other hand, as shown in FIG. 2B, the refractive index of $In_{1-x}Ga_xAs_yP_{1-y}$ gets higher as the As composition y gets higher. It is possible to restrain a leakage of a light propagating in the optical waveguide layer 105 to the low thermal conductivity layer 106, when the refractive index differential D1 is under 6%. It is therefore preferable that the As composition y is less than 55%. Accordingly, it is preferable that the As composition y is above 0 and less than 55 atm % and it is more preferable that the As composition y is more than 15 atm % and less than 55 atm %, when $In_{1-x}Ga_xAs_yP_{1-y}$ is used for the low thermal conductivity layer 106.

Next, a description will be given of composition of $In_{1-x-y}Al_xGa_yAs$. The thermal conductivity of $In_{1-x-y}Al_xGa_yAs$ is less than 1/10 of that of InP, when $In_{1-x-y}Al_xGa_yAs$ is substantially lattice matched to the InP substrate. It is therefore possible to use $In_{1-x-y}Al_xGa_yAs$ as the low thermal conductivity layer 106. Next, a description will be given of a relationship between the composition of $In_{1-x-y}Al_xGa_yAs$ and the refractive index thereof.

Figure 3:
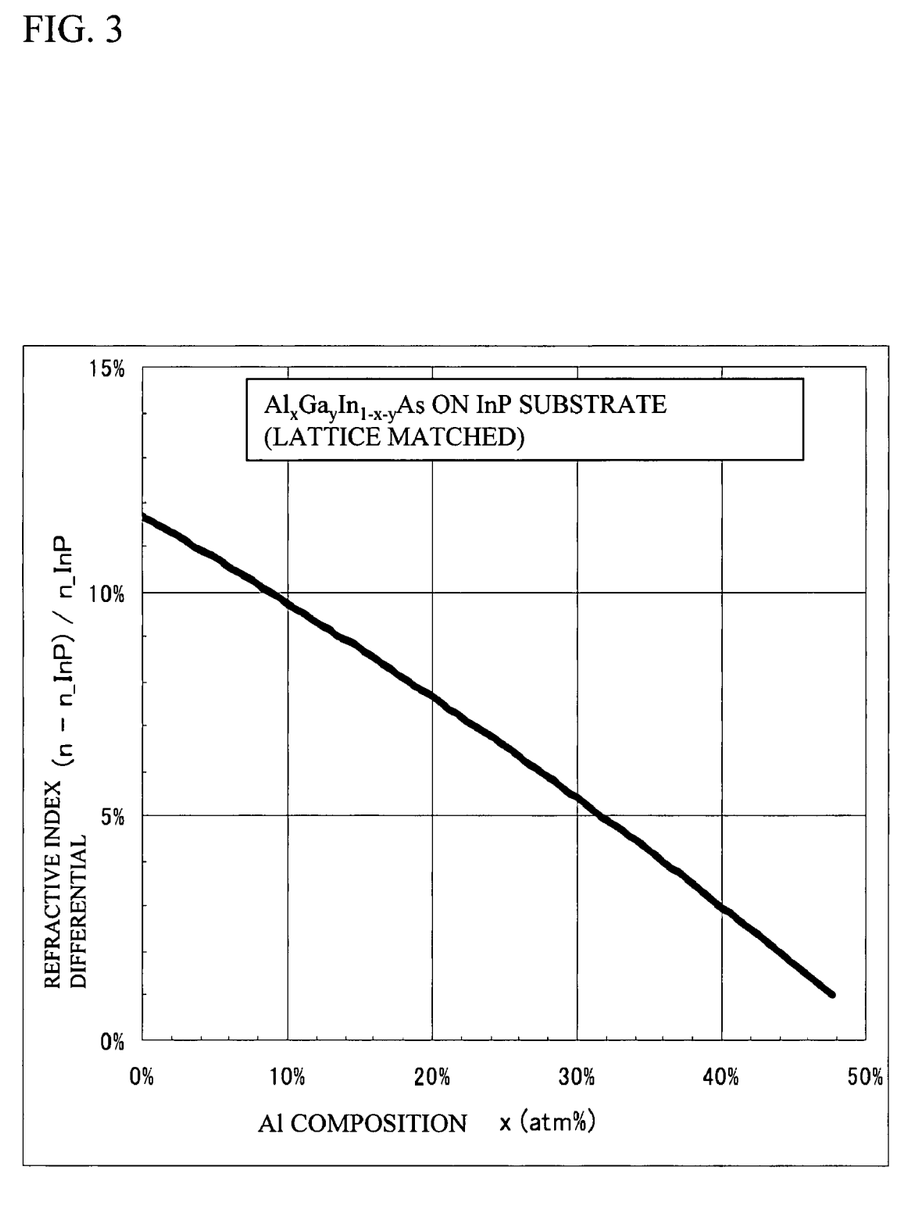
FIG. 3 illustrates a relationship between composition and a refractive index of $In_{1-x-y}Al_xGa_yAs$.

FIG. 3 illustrates a relationship between the composition of $In_{1-x-y}Al_xGa_yAs$ substantially lattice matched to the InP substrate and the refractive index thereof. The horizontal axis of FIG. 3 indicates the Al composition x (atm %). The vertical axis of FIG. 3 indicates a ratio of a differential between the refractive index of $In_{1-x-y}Al_xGa_yAs$ and the refractive index of InP against the refractive index of InP. The ratio is referred to as a refractive index differential D2 (%). As shown in FIG. 3, the refractive index differential D2 gets lower as the Al composition x gets higher. The refractive index differential D2 is under 6%, when the Al composition x is more than 26%. It is therefore preferable that the Al composition x is more than 26%.

Next, a description will be given of composition of $In_{1-x}Al_xAs_yP_{1-y}$. The thermal conductivity of $In_{1-x}Al_xAs_yP_{1-y}$ is lower than that of InP in a case where the $In_{1-x}Al_xAs_yP_{1-y}$ is substantially lattice matched to the InP substrate, when the Al composition x is above 0 or the As composition y is above 0. It is therefore possible to use $In_{1-x}Al_xAs_yP_{1-y}$ for the low thermal conductivity layer 106, at least when the Al composition x is above 0 or the As composition y is above 0. Next, a description will be given of a relationship between the composition and the refractive index of $In_{1-x}Al_xAs_yP_{1-y}$.

Figure 4:
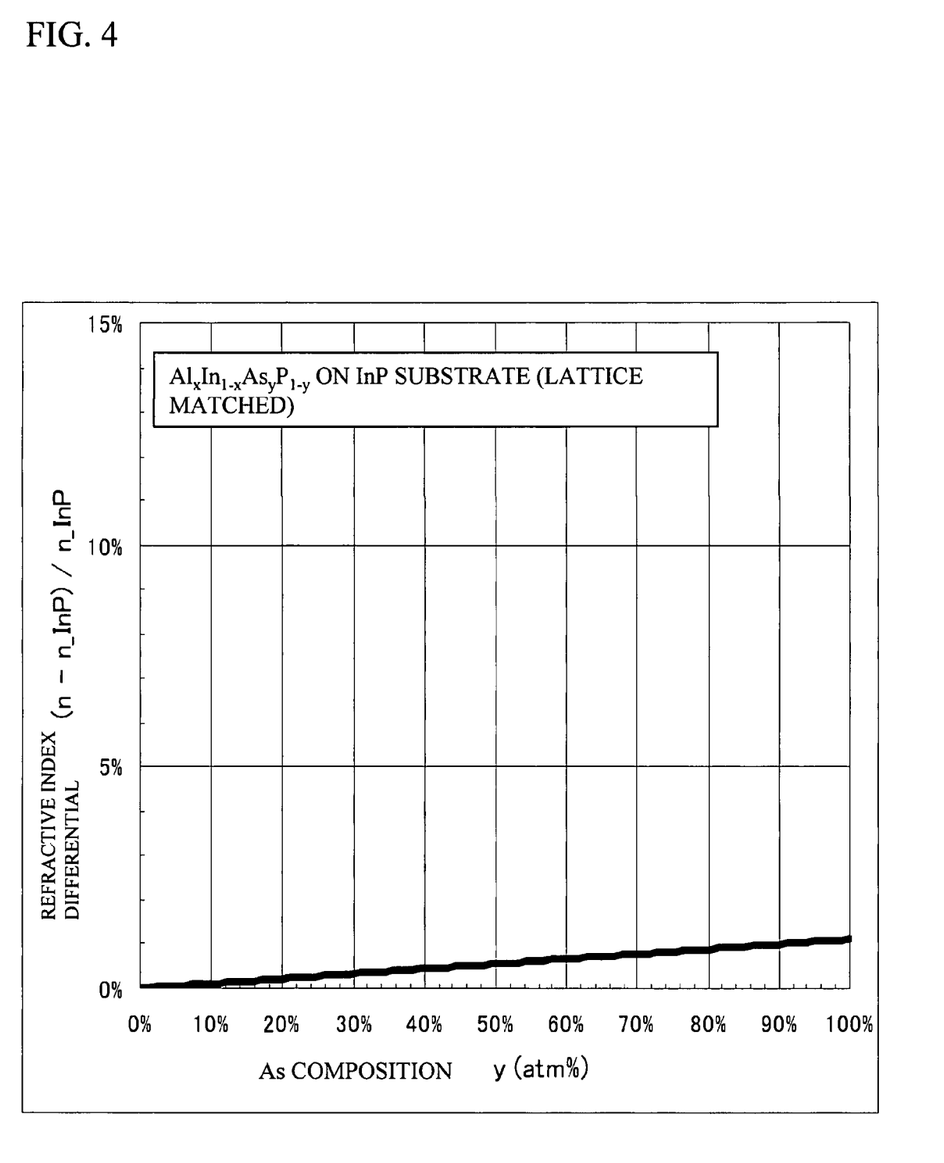
FIG. 4 illustrates a relationship between composition and a refractive index of $In_{1-x}Al_xAs_yP_{1-y}$.

FIG. 4 illustrates a relationship between the composition of $In_{1-x}Al_xAs_yP_{1-y}$ substantially lattice matched to the InP substrate and the refractive index thereof. The horizontal axis of FIG. 4 indicates the As composition y (atm %). The vertical axis of FIG. 4 indicates a ratio of a differential between the refractive index of $In_{1-x}Al_xAs_yP_{1-y}$ and the refractive index of InP against the refractive index of InP. The ratio is referred to as a refractive index differential D3 (%). As shown in FIG. 4, the refractive index differential D3 gets higher as the As composition y gets higher. However, the refractive index differential D3 does not surpass 6% regardless of the As composition y. It is therefore possible to use $In_{1-x}Al_xAs_yP_{1-y}$ for the low thermal conductivity layer 106 regardless of the As composition y. Here, a range where a semiconductor mixed crystal is substantially lattice matched to the InP substrate means a range where the alloy semiconductor crystal on the InP substrate does not cause strain relaxation.

Second Embodiment

Figure 5:
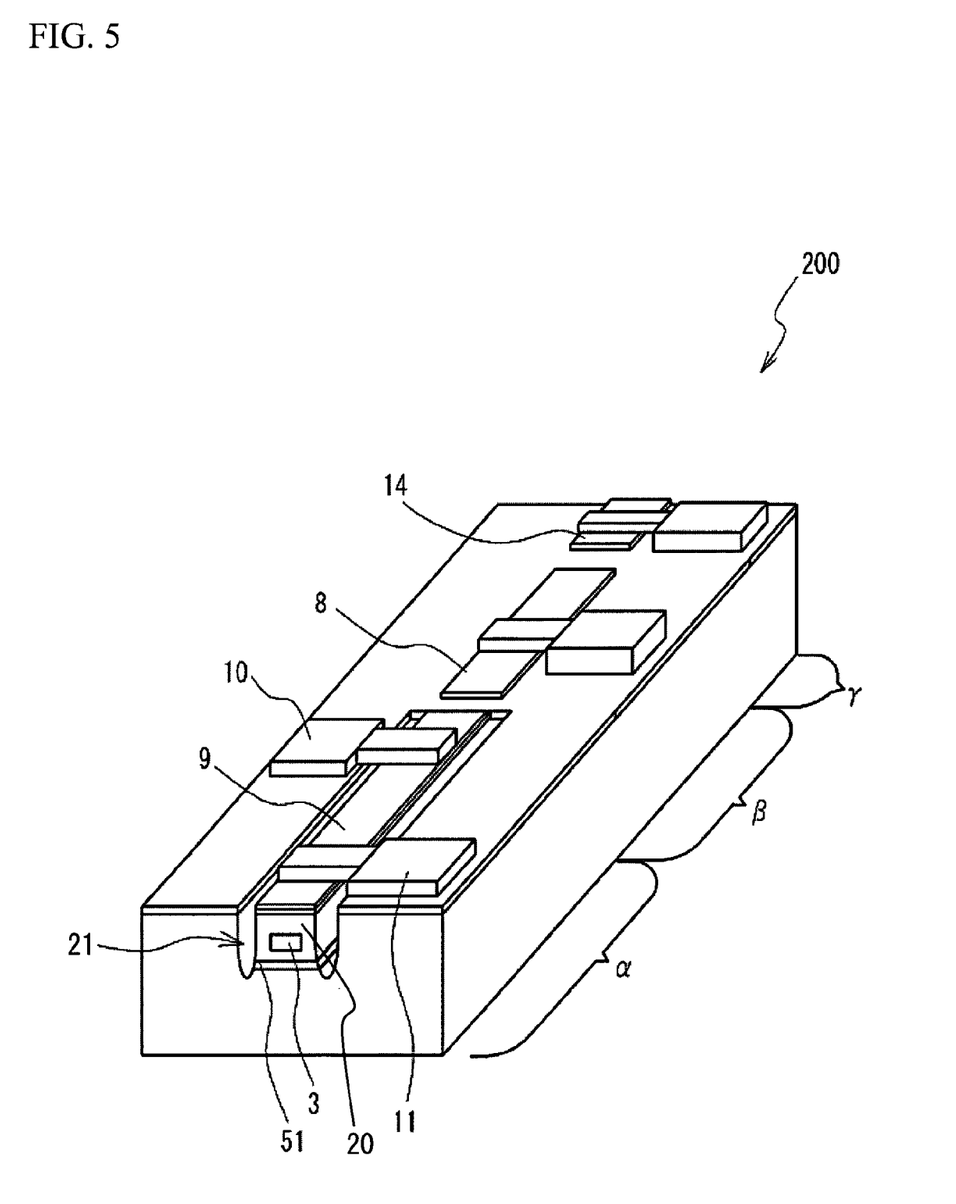
FIG. 5 illustrates a perspective view of a semiconductor laser chip in accordance with a second embodiment of the present invention.
Figure 6A:
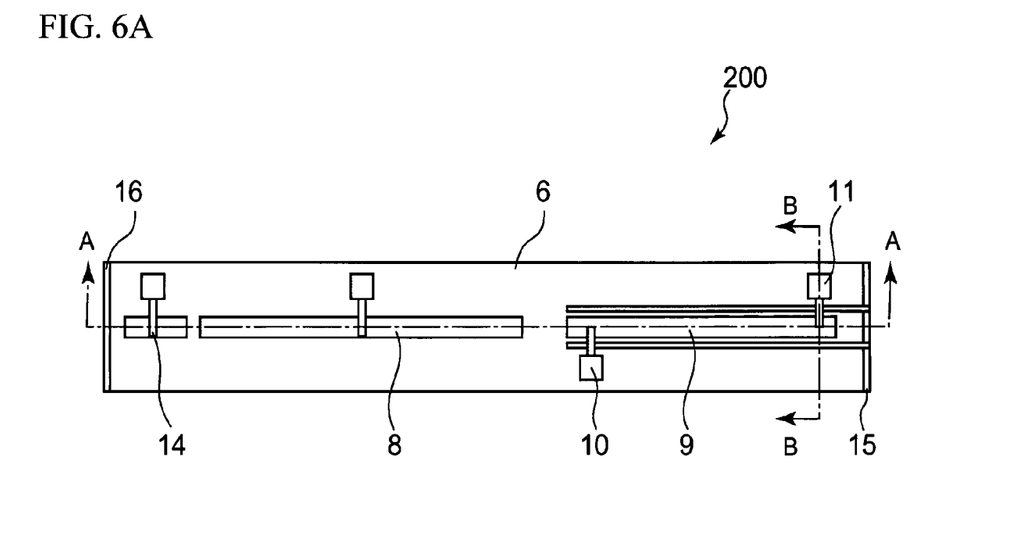
FIG. 6A illustrates a top view of a semiconductor laser chip.
Figure 6B:
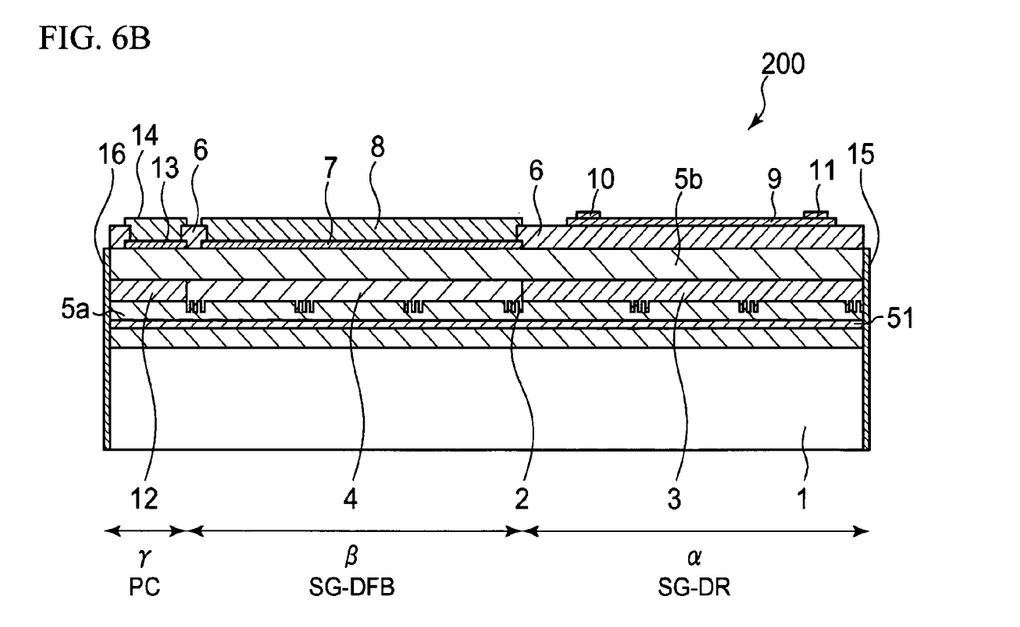
FIG. 6B illustrates a cross sectional view taken along a line A-A of FIG. 6A.

A description will be given of a semiconductor laser chip 200 in accordance with a second embodiment of the present invention. FIG. 5 illustrates a perspective view of the semiconductor laser chip 200. FIG. 6A illustrates a top view of the semiconductor laser chip 200. FIG. 6B illustrates a cross sectional view taken along a line A-A of FIG. 6A. A description will be given of the semiconductor laser chip 200 with reference to FIG. 5, FIG. 6A and FIG. 6B.

As shown in FIG. 5, FIG. 6A and FIG. 6B, the semiconductor laser chip 200 has a structure in which a Sampled Grating Distributed Reflector (SG-DR) region α, a Sampled Grating Distributed Feedback (SG-DFB) region β and a Power Control (PC) region γ are coupled in order.

The SG-DR region α has a structure in which a lower cladding layer 5a, an optical waveguide layer 3, an upper cladding layer 5b and an insulating layer 6 are laminated on a semiconductor substrate 1 in order and a heater 9, a power electrode 10 and a ground electrode 11 are laminated on the insulating layer 6. The SG-DFB region β has a structure in which the lower cladding layer 5a, an optical waveguide layer 4, the upper cladding layer 5b, a contact layer 7 and an electrode 8 are laminated on the semiconductor substrate 1 in order. The PC region γ has a structure in which the lower cladding layer 5a, an optical waveguide layer 12, the upper cladding layer 5b, a contact layer 13 and an electrode 14 are laminated on the semiconductor substrate 1 in order. The semiconductor substrate 1, the lower cladding layer 5a and the upper cladding layer 5b of the SG-DR region α, the SG-DFB region β and the PC region γ are a single layer formed as a unit respectively. A low thermal conductivity layer 51 is formed from a low reflecting coating 15 to a low reflecting coating 16 in the lower cladding layer 5a. The optical waveguide layers 3, 4 and 12 are formed on a same plane and are optically coupled.

The low reflecting coating 15 is formed on end facet of the semiconductor substrate 1, the optical waveguide layer 3, the lower cladding layer 5a and the upper cladding layer 5b at the SG-DR region α side. On the other hand, the low reflecting coating 16 is formed on end facet of the semiconductor substrate 1, the optical waveguide layer 12, the lower cladding layer 5a and the upper cladding layer 5b at the PC region γ side. Diffractive gratings 2 are formed at a given interval in the optical waveguide layers 3 and 4. The sampled grating is thus formed. The insulating layer 6 is further formed between the electrode 8 and the electrode 14.

The semiconductor substrate 1 is, for example, composed of InP. The optical waveguide layer 3 is, for example, composed of InGaAsP crystal having an absorption edge wavelength at shorter wavelengths side compared to the lasing wavelength. PL wavelength of the optical waveguide layer 3 is approximately 1.3 μm. The optical waveguide layer 4 is, for example, an active layer composed of InGaAsP crystal amplifying a light of a desirable wavelength of a laser emission. The PL wavelength of the optical waveguide layer 4 is approximately 1.57 μm. The optical waveguide layer 12 is, for example, composed of InGaAsP crystal for changing the output of the emitted light by absorbing or amplifying a light. The PL wavelength of the optical waveguide layer 12 is approximately 1.57 μm.

SG-DR optical waveguide segments are formed in the optical waveguide layer 3. Three SG-DR optical waveguide segments are formed in the optical waveguide layer 3 in the embodiment. Here, the SG-DR optical waveguide segment is a region in which one region having the diffractive grating 2 and one space region not having the diffractive grating 2 are combined in the optical waveguide layer 3.

The lower cladding layer 5a and the upper cladding layer 5b are composed of InP and confine a laser light traveling in the optical waveguide layers 3, 4 and 12. The lower cladding layer 5a has the low thermal conductivity layer 51. The low thermal conductivity layer 51 is composed of a material having a thermal conductivity lower than that of the lower cladding layer 5a. The low thermal conductivity layer 51 is, for example, composed of the same material of the low thermal conductivity layer 106. The contact layers 7 and 13 are composed of InGaAsP crystal. The insulating layer 6 is a passivation film composed of an insulator such as SiN, $SiO_2$. The low reflecting coatings 15 and 16 are, for example, composed of a dielectric film including $MgF_2$ and TiON. The reflectivity of the low reflecting coatings 15 and 16 are, for example, less than 0.3%.

The heater 9 is composed of such as NiCr. The heater 9 is formed on the insulating layer 6. The power electrode 10 and the ground electrode 11 are coupled to the heater 9. The power electrode 10, the ground electrode 11, the electrode 8 and the electrode 14 are composed of a conductive material such as Au. As shown in FIG. 5, a mesa groove 21 is formed from both sides of the heater 9 to the semiconductor substrate 1 passing through both sides of the optical waveguide layer 3. The mesa groove 21 is formed to be parallel to the optical waveguide layer 3. In the embodiment, a mesa semiconductor region 20 corresponds to the optical semiconductor region 102 of the first embodiment. The mesa semiconductor region 20 is demarcated with the mesa groove 21 and has the optical waveguide layer 3.

Next, a description will be given of an operation of the semiconductor laser chip 200. At first, a current is provided to the electrode 8. And a light is generated in the optical waveguide layer 4. The light propagates in the optical waveguide layers 3 and 4, and is reflected and amplified repeatedly. Then, it causes lasing oscillation. A part of the laser light is amplified or absorbed in the optical waveguide layer 12 and is emitted through the low reflecting coating 16. It is possible to control the gain or the absorptance of the optical waveguide layer 12 with the current provided to the electrode 14. The output of the emitted light is kept constant when a predetermined current is provided to the electrode 14.

When an electrical power is provided to the heater 9, the temperature of each SG-DR segment is controlled according to the electrical power. Therefore the refractive index of the SG-DR segment changes. And a reflection peak wavelength of the optical waveguide layer 3 changes. It is possible to control the lasing wavelength of the semiconductor laser chip 200 by controlling the electrical power to be provided to the heater 9.

The thermal resistance between the optical waveguide layer 3 and the semiconductor substrate 1 is enlarged, because the low thermal conductivity layer 51 is provided in the lower cladding layer 5a in the embodiment. It is thus possible to control the temperature of the optical waveguide layer 3 effectively with the heat generated by the heater 9. It is therefore possible to control the lasing wavelength of the semiconductor laser chip 200 effectively. The low thermal conductivity layer 51 may be formed only in the SG-DR region α.

Third Embodiment

Figure 7:
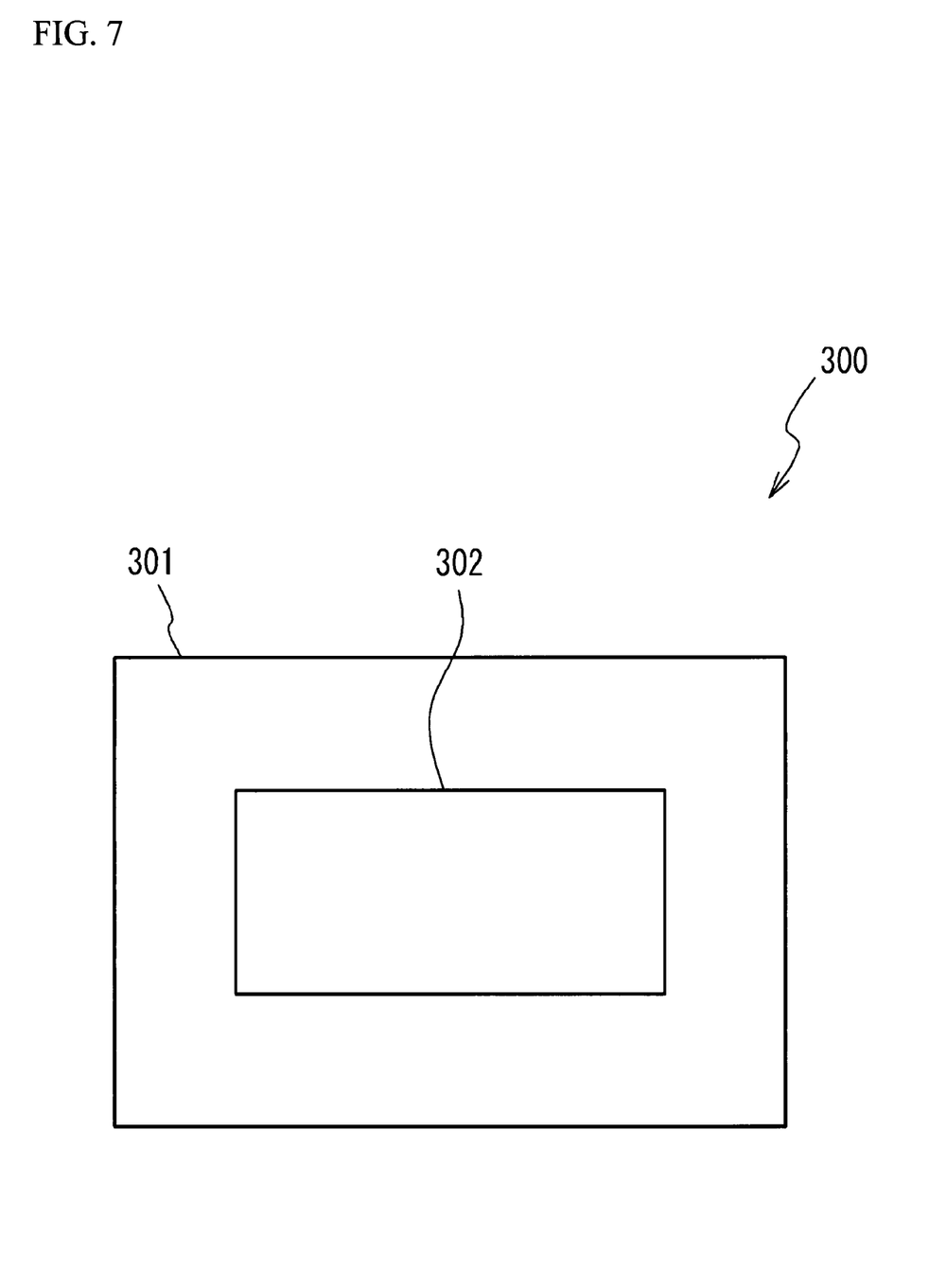
FIG. 7 illustrates an overall structure of a laser module in accordance with a third embodiment of the present invention.

A description will be given of a laser module 300 in accordance with a third embodiment of the present invention. FIG. 7 illustrates an overall structure of the laser module 300. As shown in FIG. 7, the laser module 300 has a structure in which a semiconductor laser chip 302 is provided on a temperature control device 301. The semiconductor laser chip 302 is the same as the semiconductor laser chip 200 of the second embodiment.

The temperature control device 301 controls the temperature of the semiconductor laser chip 302. The temperature control device 301 can control the reflection peak wavelength of the optical waveguide layer 4. And the laser module 300 can control the lasing wavelength with temperature control of the optical waveguide layer 3 by the heater 9 and with the temperature control of the optical waveguide layer 4 by the temperature control device 301.

Fourth Embodiment

Figure 8:
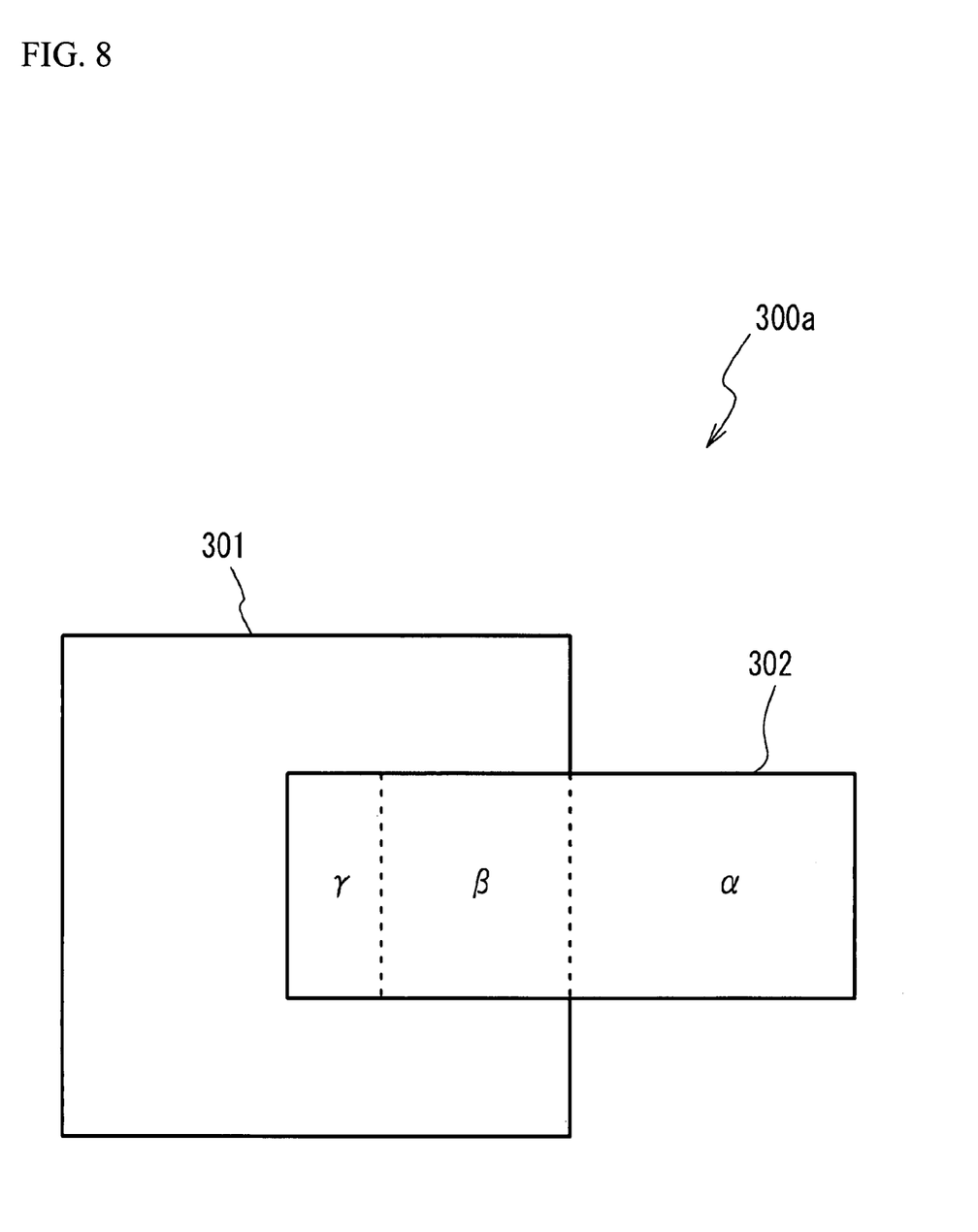
FIG. 8 illustrates an overall structure of a laser module in accordance with a fourth embodiment of the present invention.

A description will be given of a laser module 300a in accordance with a fourth embodiment of the present invention. FIG. 8 illustrates an overall structure of the laser module 300a. The laser module 300a differs from the laser module 300 shown in FIG. 7 in a position where the semiconductor laser chip 302 is arranged on the temperature control device 301. As shown in FIG. 8, the PC region γ and the SG-DFB region β are arranged on the temperature control device 301. The SG-DR region α is not arranged on the temperature control device 301.

In this case, the temperature control device 301 controls the temperature of the SG-DFB region β. And the temperature control device 301 can control the reflection peak wavelength of the optical waveguide layer 4. Accordingly, the laser module 300a in accordance with the embodiment can control the lasing wavelength with the temperature control of the optical waveguide layer 3 by the heater 9 and with the temperature control of the optical waveguide layer 4 by the temperature control device 301. Therefore, the SG-DR region α may not be arranged on the temperature control device 301. In addition, it is easy for the temperature control device 301 to control the temperature of the optical waveguide layer 4, when the low thermal conductivity layer 51 is not provided in the SG-DFB region β.

While the above description constitutes the preferred embodiments of the present invention, it will be appreciated that the invention is susceptible of modification, variation and change without departing from the proper scope and fair meaning of the accompanying claims.

The present invention is based on Japanese Patent Application No. 2006-096075 filed on Mar. 30, 2006, the entire disclosure of which is hereby incorporated by reference.

What is claimed is:

1. A semiconductor laser chip comprising:

an optical semiconductor device having a semiconductor substrate, an optical semiconductor region and a gain region;

the optical semiconductor region being provided on the semiconductor substrate and having a width smaller than that of the semiconductor substrate, a heater being provided on the optical semiconductor region, the optical semiconductor region having a cladding region, an optical waveguide layer and a low thermal conductivity layer, the optical waveguide layer being provided in the cladding region and having a refractive index higher than that of the cladding region, the low thermal conductivity layer being provided between the optical waveguide layer and the semiconductor substrate and having a thermal conductivity lower than that of the cladding region, the gain region being provided on the semiconductor substrate and being optically coupled to the optical waveguide layer.

2. The semiconductor laser chip as claimed in claim 1, wherein the gain region has a width larger than that of the optical semiconductor region.

3. The semiconductor laser chip as claimed in claim 1 further comprising an optical intensity controller that is optically coupled to the optical waveguide layer and the gain region and that absorbs or amplifies a light.

* * * * *